(12) United States Patent
Bly

(10) Patent No.: US 9,075,188 B2
(45) Date of Patent: Jul. 7, 2015

(54) METHOD OF MAKING LIGHTWEIGHT, SINGLE CRYSTAL MIRROR

(75) Inventor: Vincent T. Bly, Springfield, VA (US)

(73) Assignee: The United States of America as represented by the Administrator of the National Aeronautics and Space Administration, Washington, DC (US)

( * ) Notice: Subject to any disclaimer, the term of this patent is extended or adjusted under 35 U.S.C. 154(b) by 730 days.

(21) Appl. No.: 13/222,839

(22) Filed: Aug. 31, 2011

(65) Prior Publication Data

US 2013/0052468 A1  Feb. 28, 2013

(51) Int. Cl.
*G02B 5/10* (2006.01)
*C30B 33/08* (2006.01)
*G02B 7/183* (2006.01)
*G02B 1/02* (2006.01)

(52) U.S. Cl.
CPC . *G02B 5/10* (2013.01); *C30B 33/08* (2013.01); *G02B 7/183* (2013.01); *G02B 1/02* (2013.01)

(58) Field of Classification Search
None
See application file for complete search history.

(56) References Cited

U.S. PATENT DOCUMENTS

| | | | | |
|---|---|---|---|---|
| 3,484,327 A | * | 12/1969 | Denman | 428/188 |
| 3,753,322 A | * | 8/1973 | Bordes | 451/42 |
| 3,856,384 A | * | 12/1974 | Kryzhanovsky | 359/848 |
| 4,902,085 A | * | 2/1990 | Murakoshi et al. | 359/216.1 |
| 5,071,596 A | * | 12/1991 | Goela et al. | 264/1.21 |
| 6,045,231 A | * | 4/2000 | Martineau | 359/838 |
| 7,145,739 B1 | * | 12/2006 | Bly | 359/838 |
| 2001/0028518 A1 | * | 10/2001 | Kaiser | 359/883 |
| 2002/0043081 A1 | * | 4/2002 | Bowden et al. | 65/61 |
| 2007/0295265 A1 | * | 12/2007 | Kimura | 117/2 |
| 2010/0226030 A1 | * | 9/2010 | Baldus et al. | 359/883 |
| 2012/0182636 A1 | * | 7/2012 | Seibert et al. | 359/869 |

FOREIGN PATENT DOCUMENTS

JP      03080200 A  *  4/1991

* cited by examiner

*Primary Examiner* — Anita Alanko

(57) ABSTRACT

A method of making a mirror from a single crystal blank may include fine grinding top and bottom surfaces of the blank to be parallel. The blank may then be heat treated to near its melting temperature. An optical surface may be created on an optical side of the blank. A protector may be bonded to the optical surface. With the protector in place, the blank may be light weighted by grinding a non-optical surface of the blank using computer controlled grinding. The light weighting may include creating a structure having a substantially minimum mass necessary to maintain distortion of the mirror within a preset limit. A damaged layer of the non-optical surface caused by light weighting may be removed with an isotropic etch and/or repaired by heat treatment. If an oxide layer is present, the entire blank may then be etched using, for example, hydrofluoric acid. A reflecting coating may be deposited on the optical surface.

23 Claims, 5 Drawing Sheets

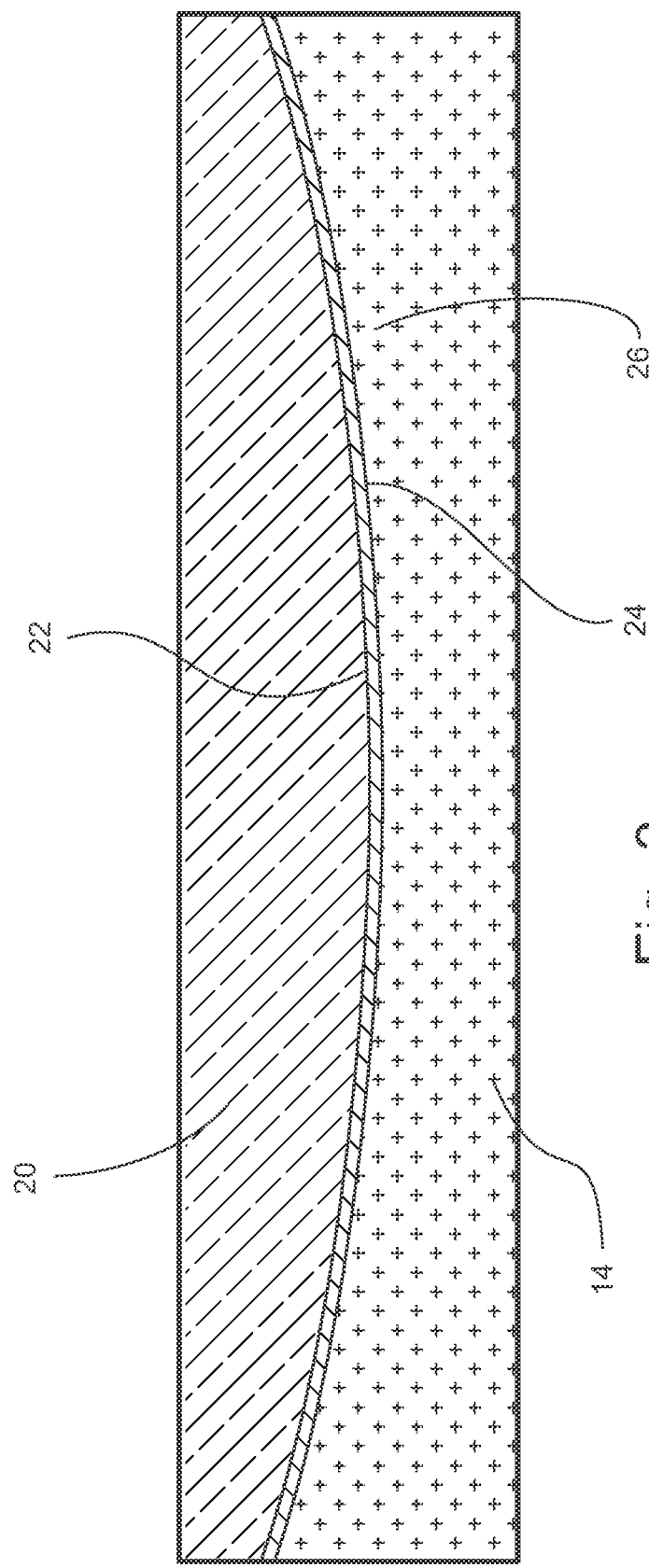

METHOD OF MAKING LIGHTWEIGHT, SINGLE CRYSTAL MIRROR

ORIGIN OF INVENTION

This invention was made by an employee of the United States Government and may be manufactured and used by or for the Government for governmental purposes without the payment of any royalties thereon or therefore.

FIELD OF THE INVENTION

The invention relates to single crystal, lightweight mirrors.

BACKGROUND

Lightweight mirrors are needed for a wide variety of applications, for example, in the space and aeronautics industries. Particularly in space and aeronautics applications, it is important to reduce the overall weight of the system. It is also important to produce precise optical components.

U.S. Pat. No. 7,145,739 issued on Dec. 5, 2006 and is entitled "Lightweight Optical Mirrors Formed in Single Crystal Substrate." The entire contents of U.S. Pat. No. 7,145,739 are expressly incorporated by reference herein. The '739 patent discloses lightweight optical mirrors formed in a single crystal substrate. Mirrors made by the '739 process may be high quality. According to the '739 process, a mirror surface is polished, and then ultrasonic machining is used to light weight the mirror. But, ultrasonic machining is a relatively time-consuming and expensive machining process.

The modest removal rate of ultrasonic machining may be a problem for larger mirrors because the volume of material to be removed by ultrasonic machining increases as the cube of the mirror diameter. Also, because ultrasonic machining depends on a working fluid, and the surface to volume ratio may change with mirror size, the design of the ultrasonic tool may need to be re-optimized as the size of the mirror increases.

A need exists for a less expensive method of making high quality, lightweight mirrors from a single crystal substrate.

SUMMARY

In one aspect, a method of making a mirror may include providing a single crystal blank and creating an optical surface on the blank. The single crystal blank may be a single crystal silicon blank. A protector may be placed on the optical surface and the blank may be light weighted by grinding a non-optical surface of the blank. Distortion of the optical surface caused by the light weighting may be reduced by one or more of: (a) removing at least a portion of a damaged layer of the non-optical surface of the blank by etching the non-optical surface with an isotropic etch, and (b) repairing at least a portion of a damaged layer of the non-optical surface of the blank by heat treating the blank. A reflecting coating may be deposited on the optical surface.

Light weighting the blank may include creating a structure having a substantially minimum mass necessary to maintain distortion of the mirror within a preset limit. The structure that is created may be, for example, substantially only a circumferential rim, or, for another example, substantially only a circumferential rim and radial webs.

The invention will be better understood, and further objects, features, and advantages thereof will become more apparent from the following description of the preferred embodiments, taken in conjunction with the accompanying drawings.

BRIEF DESCRIPTION OF THE DRAWINGS

In the drawings, which are not necessarily to scale, like or corresponding parts are denoted by like or corresponding reference numerals.

FIGS. 2A, 28, and 2C are rear perspective, front and side views, respectively, of a single crystal blank for making a mirror.

FIG. 3 is a side view of a mirror blank and a protector.

DETAILED DESCRIPTION

Figure 1:
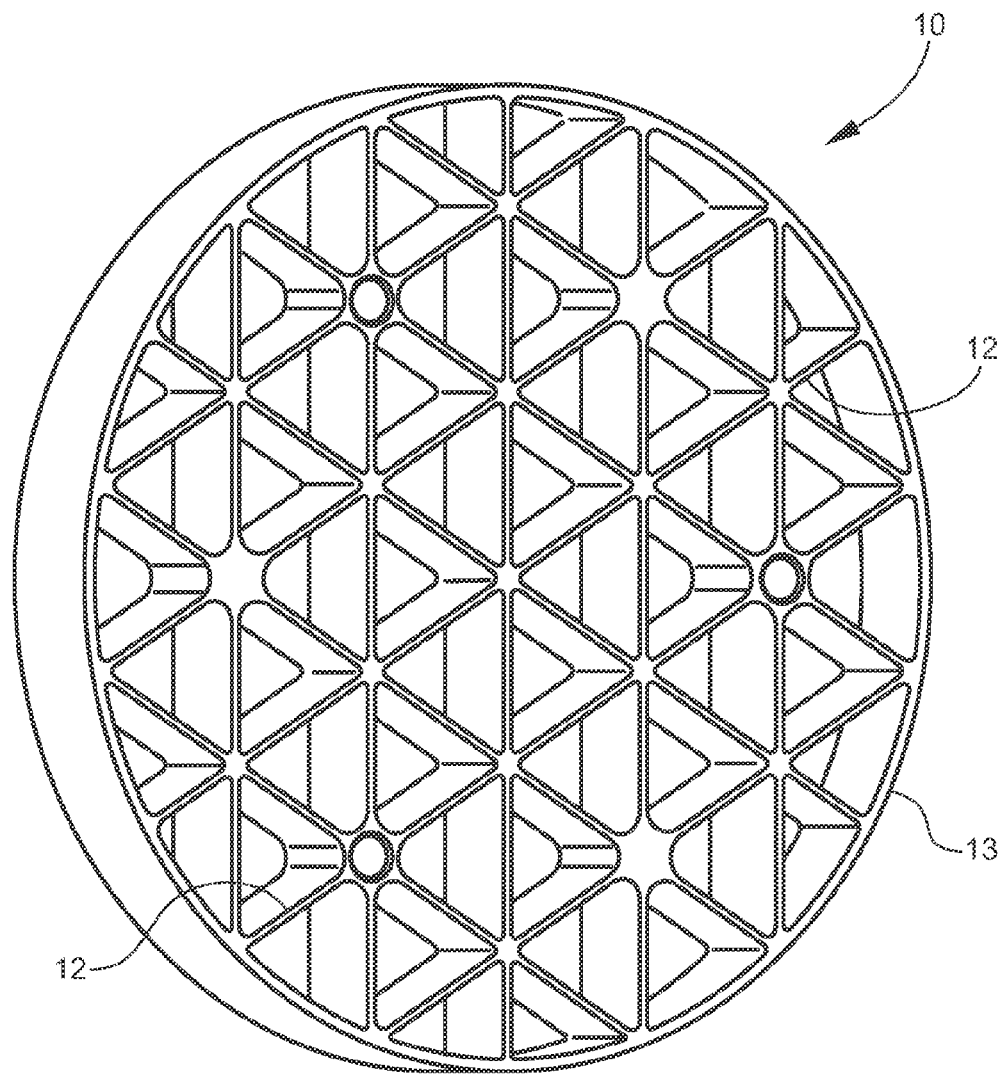
FIG. 1 is a perspective view of a mirror produced by a conventional process, viewed from the non-optical side of the mirror.

As disclosed in the '739 patent, a single crystal mirror's optical surface may be ground and polished before light weighting via ultra-sonic machining. FIG. 1 is a perspective view of a mirror 10 produced by a conventional process, viewed from the non-optical side of mirror 10. The light weighting pattern of mirror 10 may be the familiar isogrid structure shown in FIG. 1. The isogrid structure may include a plurality of triangular stiffening ribs 12. The process of creating the isogrid structure of FIG. 1 by ultrasonic machining may be time-consuming and expensive. Also, the parameters needed for successful ultrasonic machining may change significantly with the volume of material to be removed. Thus, larger mirror sizes may not be possible with the '739 method.

A primary function of the isogrid web structure may be to provide stiffness. In particular, the isogrid web structure may provide the stiffness that is necessary to support the mirror while the optical surface is ground and polished. However, because the optical surface may be ground and polished before light weighting, the isogrid web structure may not be needed to supply the stiffness needed for grinding and polishing. Thus, a mirror may only need to be stiff enough to resist self-weight deflection and distortion induced by mounting.

A novel method of making a mirror may not produce the isogrid web structure. A mirror that may be stiff enough to resist self-weight deflection and distortion induced by mounting may not require the isogrid web structure. The isogrid web structure may be eliminated and a simpler structure that may be less expensive to create may be used. The simpler structure may also have less mass than the isogrid structure.

Figure 2A:
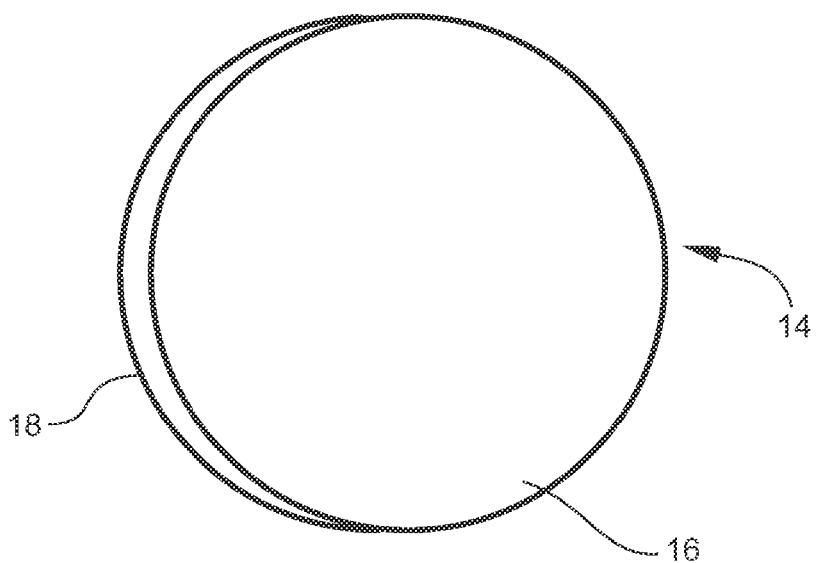
Figures 2B, 2C:
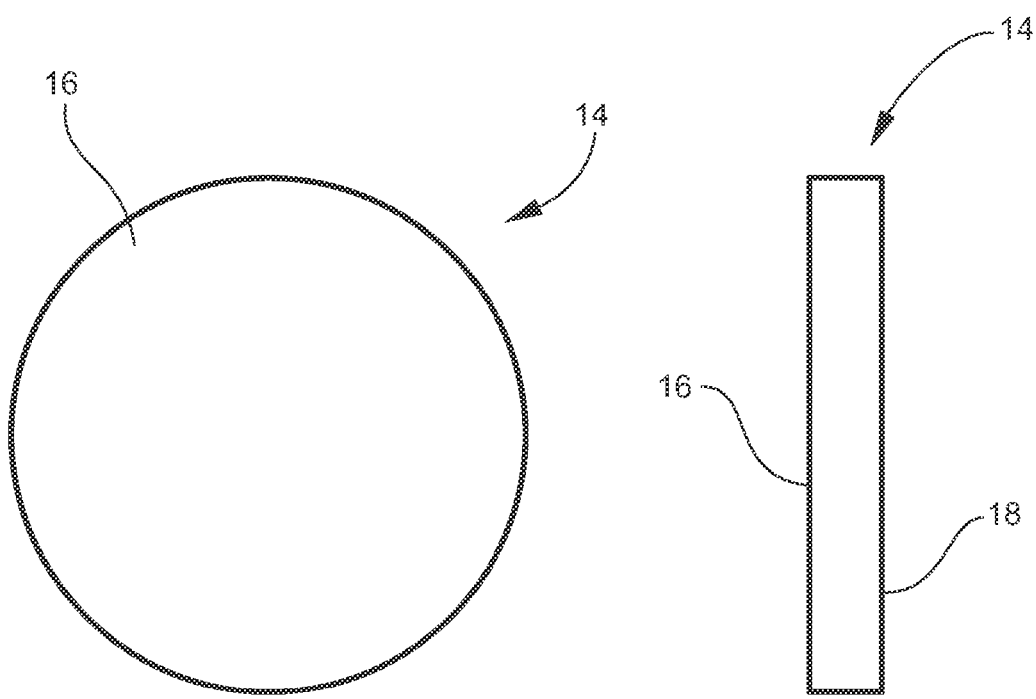

FIGS. 2A, 2B, and 2C are rear perspective, front and side views, respectively, of one embodiment of a single crystal blank 14 for making a mirror. Blank 14 may include a back, non-optical side 16 and a front, optical side 18. Blank 14 may be cylindrical in shape. In some embodiments, a diameter to thickness ratio of blank 14 may be about 8:1. The material of blank 14 may be, for example, single crystal silicon, such as boron-doped single crystal silicon. The material of blank 14 need not be dislocation free (non-slip) material.

Front and back sides 18, 16 may be fine ground so that front and back sides 18, 16 are parallel. In one embodiment, front and back sides 18, 16 may be fine ground so that front and back sides 18, 16 are parallel to 10 micrometers (~0.0005").

After fine grinding, blank 14 may be heat treated to near the melting temperature of blank 14. Silicon, for example, may have a melting temperature of about 1410 C. Thus, heat treatment near the melting temperature for silicon may be, for example, in a range of about 1100 C to about 1250 C.

In one embodiment, blank 14 may be heat treated at 1250 C. The temperature may be slowly raised from ambient to 1250 C over a period of time, for example, at least about six hours. Blank 14 may be held at 1250 C for a period of time, for example, about twelve hours. Blank 14 may be slowly cooled back to ambient temperature over a period of time, for example, at least about six hours. The heat treatment process may heal or repair crystalline damage caused by sawing and grinding processes that may be used to fabricate blank 14.

An optical surface may be created on side 18 by, for example, conventional grinding and polishing or by single point diamond turning. If the optical surface that is created is deeply curved, blank 14 may be heat treated again. The heat treatment may be, for example, as described above.

FIG. 3 is a side view of blank 14 and a protector 20. Protector 20 may be made from, for example, Pyrex. Protector 20 may have a ground surface 22 that may be curved opposite to optical surface 24 of blank 14. If blank 14 needs to be cut, for example, to form a central hole, protector 20 may be made of polycrystalline silicon. With protector 20 made from polycrystalline silicon, wire electrical discharge machining (EDM) may be used to cut both protector 20 and blank 14 together. Protector 20 may be bonded to optical surface 24 using, for example, wax 26. Number 5 stacking wax available from Universal Photonics may be used for wax 26. Wax 26 may be, for example, about 1 mm (0.040") thick.

With protector 20 bonded to blank 14, computer numerical control (CNC) grinding may be used to light weight blank 14 by removing material from back side 16. CNC grinding may also be used to form mounting points, if needed. After light weighting, protector 20 may be removed by heating blank 14 and protector 20 in an oven at, for example, about 80 C. Any remaining wax 26 may be removed using heat and then a solvent, for example, acetone.

The grinding of the light weighting process may cause crystalline damage to back side 16 that may result in a thin, damaged layer on back side 16. Stresses in the damaged layer may slightly distort optical surface 24. To produce high precision mirrors, it may be necessary to reduce the distorting effect of the damaged layer. Some or all of the damaged layer may be removed by etching back side 16 with an isotropic etch, for example, HNA (hydrofluoric, nitric, and acetic acid mix). In lieu of etching with an isotropic etch, or, before or after isotropic etching, at least a portion of the damaged layer may be repaired or healed by heat treatment.

The effect of any crystalline damage may lessen as mirror diameter increases. As mirror diameter increases, the crystalline damage may decrease approximately as the cube of the mirror diameter. That is, as the mirror diameter increases, the thickness of the damaged layer may remain approximately constant while the thickness of the mirror surface increases linearly and the stiffness of the mirror increases by the cube of its thickness.

When heat treatment is performed in air, an oxide layer may form on blank 14. When blank 14 is made of silicon, the oxide layer may be silicon dioxide. The oxide layer may be removed by etching the entire blank 14 including optical surface 24 in, for example, hydrofluoric acid. The hydrofluoric acid etching process may remove the oxide layer that may have formed during the heat treatment process. When heat treatment is not performed in air (for example, heat treatment in a purgeable high temperature oven), the step of etching the entire blank 14, including the optical surface 24, in hydrofluoric acid may not be needed. After the oxide layer (if present) is removed by etching, a reflective coating may be deposited on optical surface 24, for example, by vacuum deposition.

Light weighting of blank 14 by grinding back side 16 may create a structure on back side 16 that is sufficient to maintain distortion of the finished mirror within a predetermined limit. Distortion may be caused by, for example, self-weight and/or mounting errors of the mirror. Preferably, light weighting of blank 14 by grinding may create a structure on back side 16 that may have a substantially minimum mass necessary to maintain distortion of the finished mirror within a predetermined limit. Such minimum mass structures may be less complex than the known isogrid structure.

Figure 4:
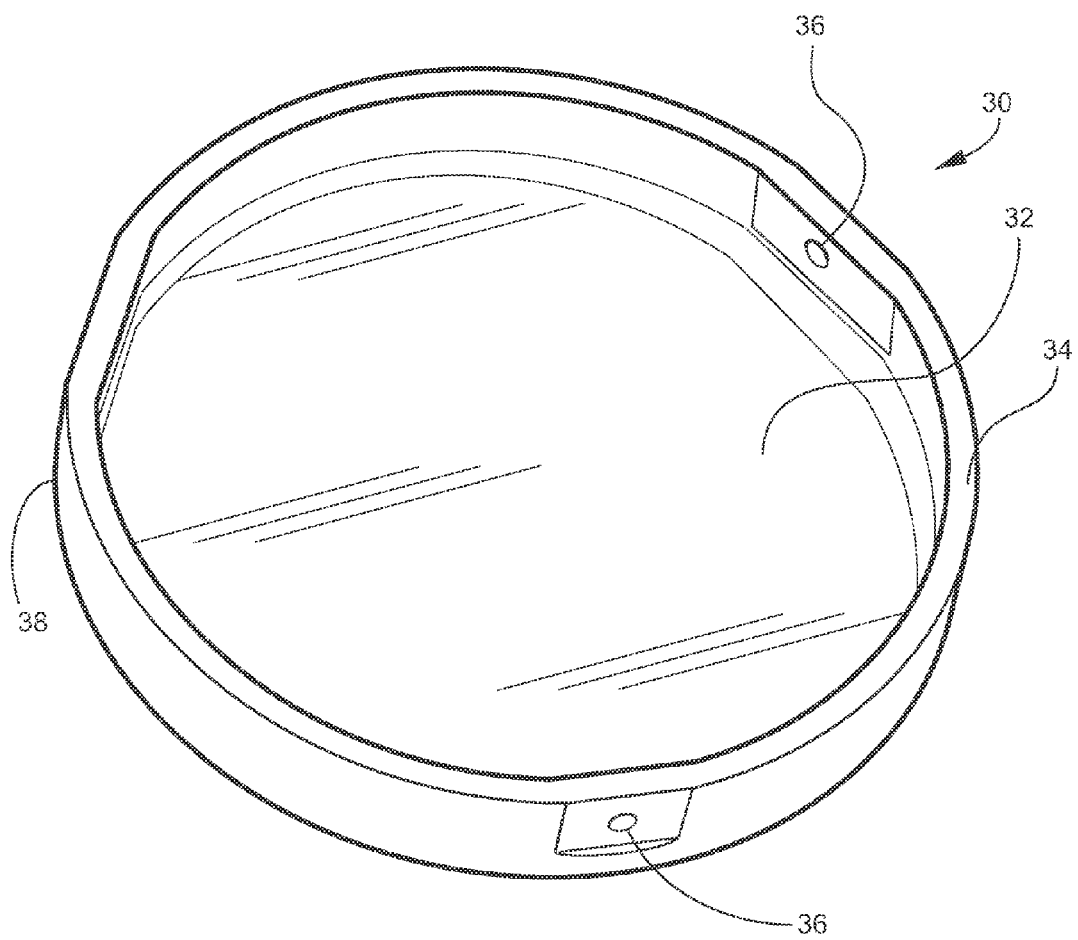
FIG. 4 is a perspective view of an embodiment of a novel mirror, viewed from the non-optical side of the mirror.

For example, FIG. 4 is a perspective view of an embodiment of a mirror 30 having a non-optical side 32 and an optical side 38. Mirror 30 may be produced by the novel mirror-making process. Non-optical side 32 may include a circumferential rim 34 for stiffness, to prevent excessive distortion of mirror 30. Rim 32 may include one or more mounting holes 36. Generally, a thickness of rim 32 may be greater than a thickness of rim 13 (FIG. 1) that may be present with an isogrid structure. Also, rim 32 may be additionally thickened in areas of mounting holes 36.

Figure 5:
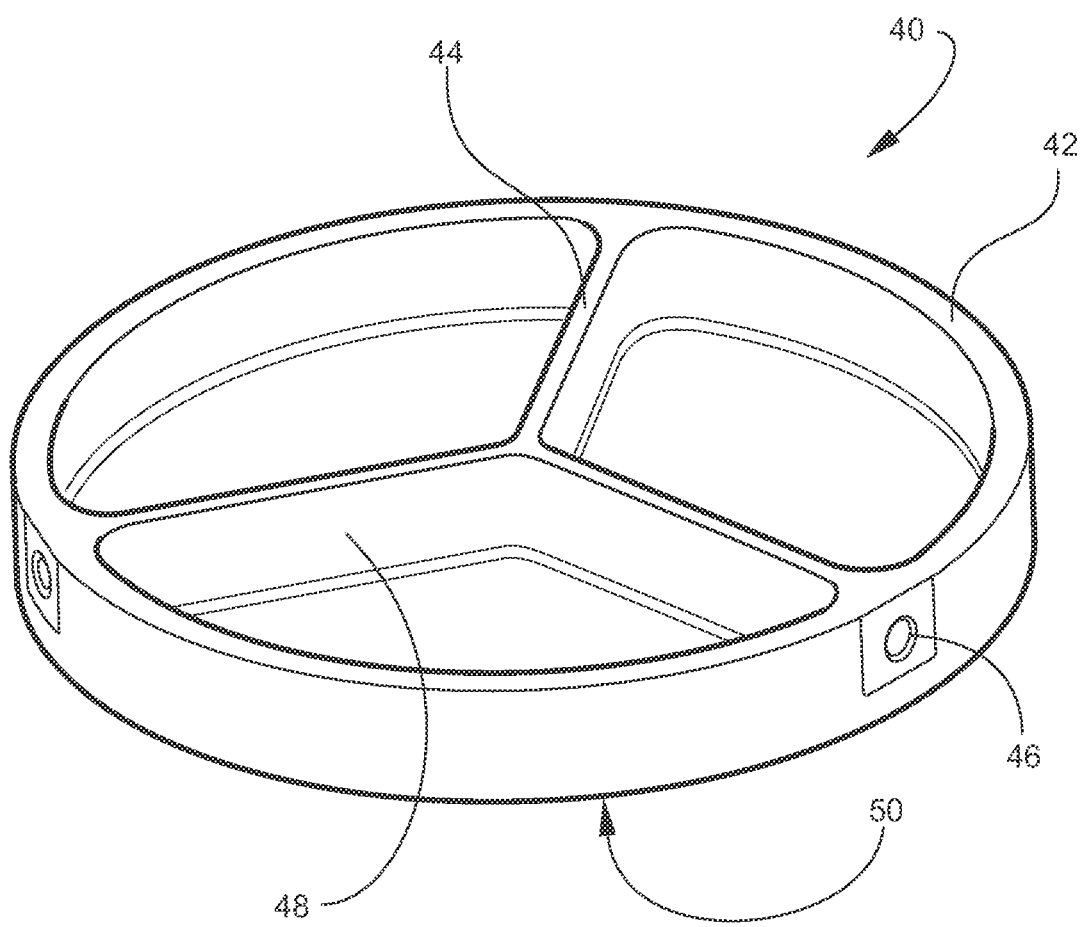
FIG. 5 is a perspective view of another embodiment of a novel mirror, viewed from the non-optical side of the mirror.

FIG. 5 is a perspective view of another embodiment of a mirror 40 having a non-optical side 48 and an optical side 50. Mirror 40 may be produced by the novel mirror-making process. Non-optical side 48 may include a circumferential rim 42 and a plurality of radial webs 44 for stiffness. In one embodiment, there may be three webs 44. Other numbers of radial webs 44 may be used. The webs 44 may be equally spaced. Rim 42 may include mounting holes 46. The number of mounting holes 46 may be the same as the number of radial webs 44. As shown in FIG. 5, each mounting hole 46 may be radially aligned with a respective radial web 44. Distortion caused by mounting errors may be resisted by aligning mounting holes 46 with radial webs 44.

The back side structures shown in FIGS. 4 and 5 are simpler than the isogrid structure of FIG. 1. The structures in FIGS. 4 and 5 may be formed by computer controlled grinding, which may be faster and less expensive than the ultrasonic machining used to produce the mirror 10 of FIG. 1.

While the invention has been described with reference to certain preferred embodiments, numerous changes, alterations and modifications to the described embodiments are possible without departing from the spirit and scope of the invention as defined in the appended claims, and equivalents thereof.

What is claimed is:

1. A method of making a mirror, comprising:
   providing a single crystal blank with a back, non-optical side and a front, optical side, further the blank of cylindrical shape with the material of the blank made from boron-doped single crystal silicon composed of non dislocation free (non-slip) material; then
   creating an optical surface on the blank; then
   placing a protector on the optical surface made from Pyrex with a around surface curved opposite to optical surface of the front of the blank; then
   light weighting the blank by grinding a non-optical surface of the blank; then
   reducing distortion of the optical surface caused by the light weighting; and then
   depositing a reflecting coating on the optical surface wherein the non-optical side includes a circumferential rim with a plurality of equally spaced radial webs for stiffness with multiple mounting holes, each mounting hole radially aligned with a respective radial web to prevent excessive distortion of the mirror with the rim thickened in areas of each mounting hole.

2. The method of claim 1, wherein providing includes fabricating a single crystal silicon blank.

3. The method of claim 1, wherein providing includes providing a single crystal silicon blank that is generally cylindrical in shape.

4. The method of claim 1, wherein providing includes providing a single crystal silicon blank comprising boron-doped silicon.

5. The method of claim 1, wherein creating the optical surface includes creating the optical surface by grinding and polishing.

6. The method of claim 1, wherein creating the optical surface includes creating the optical surface by single point diamond turning.

7. The method of claim 1, further comprising, after creating the optical surface, heat treating the blank.

8. The method of claim 1, wherein placing the protector includes bonding the protector to the optical surface with wax.

9. The method of claim 1, wherein light weighting the blank by grinding the non-optical surface of the blank includes computer controlled grinding of the non-optical surface of the blank.

10. The method of claim 1, further comprising, before depositing, removing the protector.

11. The method of claim 1, wherein reducing distortion of the optical surface caused by the light weighting includes removing at least a portion of a damaged layer of the non-optical surface of the blank by etching the non-optical surface with an isotropic etch.

12. The method of claim 1, wherein reducing distortion of the optical surface caused by the light weighting includes repairing at least a portion of a damaged layer of the non-optical surface of the blank by heat treating the blank.

13. The method of claim 1, wherein depositing includes vacuum depositing a reflective coating on the optical surface.

14. The method of claim 1, further comprising, before depositing, etching the entire blank, including the optical surface.

15. The method of claim 3, wherein providing includes providing a single crystal silicon blank that is cylindrical in shape and has a diameter to thickness ratio of about 8:1.

16. The method of claim 5, further comprising, after fine grinding, heat treating the blank to near its melting temperature.

17. The method of claim 9, wherein light weighting the blank by grinding the non-optical surface of the blank includes creating a structure having a substantially minimum mass necessary to maintain distortion of the mirror within a preset limit.

18. The method of claim 11, wherein reducing distortion of the optical surface caused by the light weighting includes repairing at least a portion of the damaged layer of the non-optical surface of the blank by heat treating the blank.

19. The method of claim 17, wherein the distortion is due to one of self-weight and mounting errors of the mirror.

20. The method of claim 17, wherein the structure comprises substantially only a circumferential rim.

21. The method of claim 17, wherein the structure comprises substantially only a circumferential rim and three radial webs spaced equally apart.

22. The method of claim 18, wherein heat treating the blank to repair at least a portion of the damaged layer of the non-optical surface of the blank includes heat treating the blank to near its melting temperature.

23. A method of making a mirror, comprising:

providing a single crystal silicon blank with a back, non-optical side and a front, optical side, further the blank of cylindrical shape with the material of the blank made from boron-doped single crystal silicon composed of non dislocation free (non-slip) material that is generally cylindrical in shape; then fine grinding top and bottom surfaces of the blank to be parallel; then heat treating the blank to near its melting temperature; then creating an optical surface on the blank; then placing a protector on the optical surface made from Pyrex with a ground surface curved opposite to optical surface of the front of the blank; then light weighting the blank by grinding a non-optical surface of the blank using computer controlled grinding, the light weighting including creating a structure having a substantially minimum mass necessary to maintain distortion of the minor within a preset limit; wherein the non-optical side includes a circumferential rim with a plurality of equally spaced radial webs for stiffness with multiple mounting holes, each mounting hole radially aligned with a respective radial web to prevent excessive distortion of the mirror with the rim thickened in areas of each mounting hole; then reducing distortion of the optical surface caused by the light weighting by at least one of a) removing a damaged layer of the non-optical surface of the blank by etching the non-optical surface with an isotropic etch and b) repairing a damaged layer of the non-optical surface using heat treatment; and then depositing a reflecting coating on the optical surface.

* * * * *